US009282637B2

(12) United States Patent
Yun et al.

(10) Patent No.: US 9,282,637 B2
(45) Date of Patent: Mar. 8, 2016

(54) EPOXY RESIN COMPOUND AND RADIANT HEAT CIRCUIT BOARD USING THE SAME

(71) Applicant: LG INNOTEK CO., LTD., Seoul (KR)

(72) Inventors: Sung Jin Yun, Seoul (KR); Hyuk Soo Lee, Seoul (KR); In Hee Cho, Seoul (KR); Jae Man Park, Seoul (KR); Myeong Jeong Kim, Seoul (KR); Jong Heum Yoon, Seoul (KR); Jeung Ook Park, Seoul (KR); Jong Sik Lee, Seoul (KR); Gun Young Gil, Seoul (KR); Thanh Kieu Giang, Suwon-si (KR); Jin Hwan Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 127 days.

(21) Appl. No.: 13/968,812

(22) Filed: Aug. 16, 2013

(65) Prior Publication Data

US 2014/0048316 A1    Feb. 20, 2014

(30) Foreign Application Priority Data

Aug. 16, 2012    (KR) .................. 10-2012-0089542

(51) Int. Cl.
| | |
|---|---|
| *B32B 27/38* | (2006.01) |
| *H05K 1/02* | (2006.01) |
| *H05K 1/03* | (2006.01) |
| *C08G 59/28* | (2006.01) |
| *C08G 59/30* | (2006.01) |
| *C08L 63/00* | (2006.01) |
| *H05K 1/05* | (2006.01) |
| *C08K 3/00* | (2006.01) |

(52) U.S. Cl.
CPC .............. *H05K 1/0373* (2013.01); *C08G 59/28* (2013.01); *C08G 59/30* (2013.01); *C08K 3/0033* (2013.01); *C08L 63/00* (2013.01); *H05K 1/0203* (2013.01); *H05K 1/056* (2013.01); *H05K 2201/0209* (2013.01)

(58) Field of Classification Search
None
See application file for complete search history.

(56) References Cited

U.S. PATENT DOCUMENTS 5,364,912 A  *  11/1994  Hefner et al. ................. 525/418
2013/0284502 A1*  10/2013  Park ....................... C08L 63/00
                                                                    174/255

FOREIGN PATENT DOCUMENTS

WO    WO2012091320   *  7/2012

* cited by examiner

*Primary Examiner* — Coris Fung
(74) *Attorney, Agent, or Firm* — Saliwanchik, Lloyd & Eisenschenk

(57) ABSTRACT

There is provided an epoxy resin compound including an epoxy resin including a crystalline epoxy, a curing agent, and an inorganic filler. Also, there is provided a radiant heat circuit board including a metal plate, an insulating layer formed on the metal plate; and a circuit pattern formed on the insulating layer, in which the insulting layer is formed by curing an epoxy resin compound including an epoxy resin including a crystalline epoxy, a curing agent, and an inorganic filler.

7 Claims, 1 Drawing Sheet

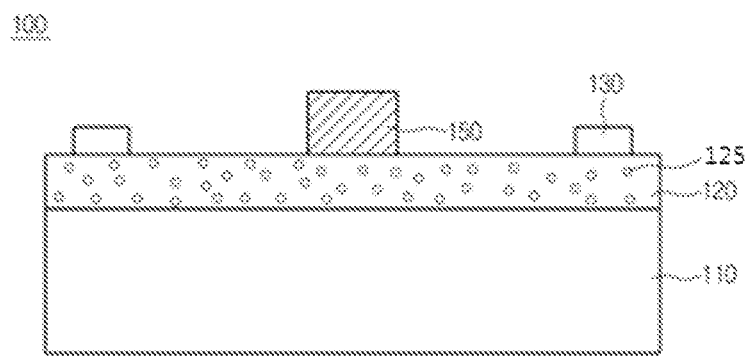

EPOXY RESIN COMPOUND AND RADIANT HEAT CIRCUIT BOARD USING THE SAME

CROSS-REFERENCE TO RELATED APPLICATION

This application claims the benefit under 35 U.S.C. §119 of Korean Patent Application No. 10-2012-0089542, filed Aug. 16, 2012, which is hereby incorporated by reference in its entirety.

BACKGROUND

1. Field of the Invention

The present invention relates to an epoxy resin compound, and more particularly, to an epoxy resin compound used for an insulating layer of a radiant heat circuit board.

2. Discussion of Related Art

A circuit board, which includes a circuit pattern in an electric insulating board, is a board for mounting an electronic component or the like.

The electronic component includes a heat-generating device, for example, a light emitting diode (LED) or the like. The heat-generating device generates a large amount of heat. The heat generated from the heat-generating device increases the temperature of the circuit board and may cause the heat-generating device to malfunction and function unreliably.

Therefore, it is important that the circuit board has a radiant heat structure for discharging heat to the outside from the electronic component, and this is greatly affected by the thermal conductivity of an insulating layer formed on the circuit board.

In order to increase thermal conductivity of the insulating layer, an inorganic filler should be filled to a high density, and for this purpose an epoxy resin having a superior low viscosity has been proposed.

Examples of widely used low-viscosity epoxy resins include bisphenol A type epoxy resin, bisphenol F type epoxy resin, or the like. However, such epoxy resins are difficult to handle because they are liquid at room temperature, and they are disadvantageous in terms of heat resistance, mechanical strength, and toughness.

BRIEF SUMMARY

The present invention is directed to providing an epoxy resin compound having a new composition.

The present invention is directed to providing a radiant heat circuit board in which heat efficiency is improved.

One aspect of the present invention provides an epoxy resin compound including an epoxy resin having a double bond (i.e., —CH=N—) of C and N in a molecular structure, a curing agent, and an inorganic filler.

Another aspect of the present invention provides a radiant heat circuit board including a metal plate, an insulating layer formed on the metal plate; and a circuit pattern formed on the insulating layer, in which the insulting layer is formed by curing an epoxy resin compound including an epoxy resin having a double bond (i.e., —CH=N—) of C and N in a molecular structure, a curing agent, and an inorganic filler.

BRIEF DESCRIPTION OF THE DRAWINGS

The above and other objects, features and advantages of the present invention will become more apparent to those skilled in the art by describing in detail exemplary embodiments thereof with reference to the attached drawings, in which:

FIG. 1 is a cross-sectional view illustrating a radiant heat circuit board according to one embodiment of the present invention.

DETAILED DESCRIPTION

Hereinafter, embodiments of the present invention will be described in detail with reference to the accompanying drawings such that the present invention may easily be carried out by those skilled in the art. However, the present invention is not limited to the embodiments described herein and may be realized in various other forms.

Throughout the detailed description, when a part is described as including a component, it should be understood that the part may include not only the component, but other components as well, unless specifically stated otherwise.

In the drawings, regions that are unimportant to the invention may be omitted and thicknesses of layers and regions may be exaggerated for the sake of clarity. Throughout the specification, like reference numerals denote like elements.

It will be understood that when a layer, a film, a region, or a plate is referred to as being on another layer, film, region, or plate, it may be directly on the other layer, film, region, or plate, or intervening layers, films, regions, or plates may also be present. However, if a layer, a film, a region, or a plate is referred to as being directly on another layer, film, region, or plate, then there is no intervening layer, film, region, or plate.

One embodiment according to the present invention provides an epoxy resin compound in which thermal conductivity and glass transition temperature are improved due to high crystallinity, and a radiant heat circuit board using the same.

The crystalline epoxy resin compound according to one embodiment of the present invention includes an epoxy resin, a curing agent, and an inorganic filler.

The epoxy resin may include at least 12 wt % of crystalline epoxy resin, and preferably at least 50 wt % of crystalline epoxy resin.

The crystalline epoxy resin is represented by the following chemical formula.

[Chemical Formula 1]

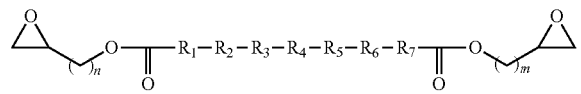

In Chemical Formula 1, $R_1$, $R_3$, $R_5$ and $R_7$ each independently represent a single bond, or an aromatic ring structure having C6 to C24, $R_2$ and $R_6$ each independently represent a single bond or a double bond (i.e., —CH=N—) of C and N, and at least any one of $R_2$ and $R_6$ represents a double bond (i.e., —CH=N—) of C and N, $R_4$ represents an oxygen atom, a sulfur atom, or a phosphorus atom, and m and n are each independently an integer of 0 to 5, and when m or n is 0 it refers to a single bond, in which hydrogen of each of $R_1$ to $R_7$ may be substituted with at least one group selected from the group consisting of an alkyl group having of C1 to C4, an aryl group having C6 to C18, and a cyanide group.

According to one embodiment of the present invention, in Chemical Formula 1, $R_1$, $R_3$, $R_5$ and $R_7$ each independently represent a single bond, or arylene having C6 to C18, $R_2$ and $R_6$ each represent a double bond (i.e., —CH=N—) of C and N, $R_4$ represents an oxygen atom, and m and n are each independently an integer of 1 to 3.

According to another embodiment of the present invention, in Chemical Formula 1, $R_1$, $R_3$, $R_5$ and $R_7$ each represent phenylene, $R_2$ and $R_6$ each represent a double bond (i.e., —C=N—) of C and N, $R_4$ represents an oxygen atom, and m and n are each independently an integer of 1 to 2.

According to another embodiment of the present invention, $1 \leq n \leq 3$ and $1 \leq m \leq 3$ are satisfied, $R_1$, $R_3$, $R_5$ and $R_7$ each represent one to three benzenes, $R_2$ and $R_6$ each represent a cyanide group, and $R_4$ may include an oxygen atom.

According to another embodiment of the present invention, the crystalline epoxy resin may be represented by the following chemical formula 2.

Second Step

In other words, in the first step, about 3 g of 4-carboxybenzaldehyde is dissolved in methanol and vigorously stirred, then about 1.24 g of 4-(4-aminophenoxy) is added thereto drop by drop, and subsequently the resultant is kept for 24 hours. When a yellow solid is precipitated, the yellow solid is filtered, washed several times with methanol, and dried under vacuum at about 40° C.

The first step may have a yield of at least 94%.

Subsequently, in the second step, 5 g of the intermediate synthesized in the first step and 50 mL of DMAc are added and stirred while applying heat, then 52.7 mL of epichlorohydrin and 0.22 g of TBAB as a catalyst are added thereto at room temperature, and then the mixture is heated to a temperature of 110° C. and stirred for 6 hours.

The reacted mixture is slowly reduced to room temperature and poured into methanol to generate a yellow solid. The yellow solid is filtered, washed several times with methanol, and dried under vacuum at 40° C.

The second step may have a yield of at least 80%.

[Chemical formula 2]

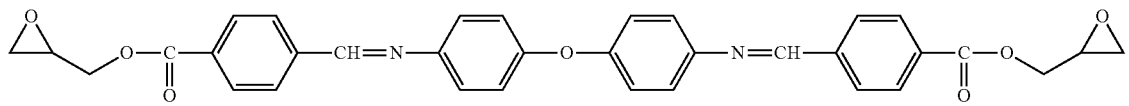

The crystalline epoxy resin represented by Chemical Formula 2 may have a melting point of about 200° C., in which nuclear magnetic resonance of hydrogen (H-NMR) measured is as follows: d=8.55 (s, 2H), d=8.16-8.17 (d, 4H), d=7.98-7.99 (d, 4H), d=7.28-7.30 (d, 4H), d=7.08-7.09 (d, 4H), d=4.68-4.71 (d, 1H), d=4.18-4.26 (m, 1H), d=3.35-3.39 (m, 1H), d=2.91-2.93 (m, 1H) and d=2.74-2.76 (m, 1H).

The crystalline epoxy resin represented by Chemical Formula 2 may be synthesized through the following mechanism.

The epoxy resin may be included in 3 wt % to 60 wt % based on the total weight of the epoxy resin compound.

When the content of the crystalline epoxy resin is less than the aforementioned amount, the epoxy resin is not crystallized at the time of curing and thus has less effect of thermal conductivity or the like.

The epoxy resin further includes a general amorphous epoxy resin in which a molecule has at least two epoxy groups as well as the crystalline epoxy resin which is an essential component.

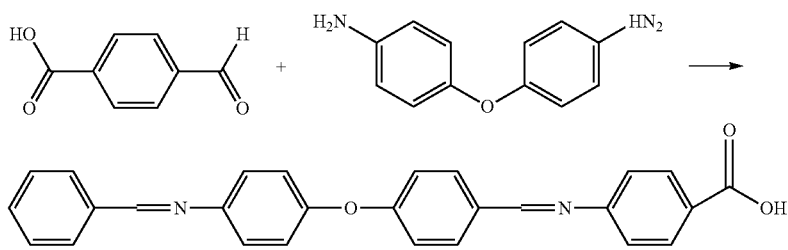

First Step

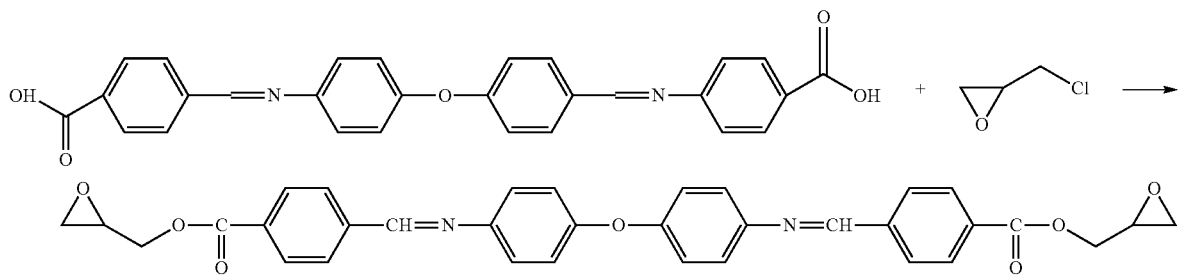

Examples of the amorphous epoxy resin include: bisphenol A; 3,3',5,5'-tetramethyl-4,4'-dihydroxydiphenylmethane; 4,4'-dihydroxydiphenylsulfone; 4,4'-dihydroxydiphenylsulfide; 4,4'-dihydroxydiphenylketone; fluorenbisphenol; 4,4'-biphenol, 3,3',5,5'-tetramethyl-4,4'-dihydroxybiphenyl; 2,2'-biphenol; resorcin; catechol; t-butylcatechol; hydroquinone; t-butylhydroquinone; 1,2-dihydroxynaphthalene; 1,3-dihydroxynaphthalene; 1,4-dihydroxynaphthalene; 1,5-dihydroxynaphthalene; 1,6-dihydroxynaphthalene; 1,7-dihydroxynaphthalene; 1,8-dihydroxynaphthalene; 2,3-dihydroxynaphthalene; 2,4-dihydroxynaphthalene; 2,5-dihydroxynaphthalene; 2,6-dihydroxynaphthalene; 2,7-dihydroxynaphthalene; 2,8-dihydroxynaphthalene; allylated compounds or polyallylated compounds of the dihyroxynaphthalene; divalent phenols such as allylated bisphenol A, allylated bisphenol F, allylated phenol novolac; trivalent or more phenols such as phenol novolac, bisphenol A novolac, o-cresol novolac, m-cresol novolac, p-cresol novolac, xylenol novolac, poly-p-hydroxystyrene, tris-(4-hydroxyphenyl)methane, 1,1,2,2-tetrakis(4-hydroxyphenyl)ethane, fluoroglycinol, pyrogallol, t-butylpyrogallol, allylated pyrogallol, polyallylated pyrogallol, 1,2,4-benzenetriol, 2,3,4-trihydroxybenzophenon, phenolaralkyl resin, naphthol aralkyl resin, dicyclopentadiene-based resin; and glycidyl etherficated compounds derived from halogenated bisphenols such as tetrabromobisphenol A. For example, the listed amorphous epoxy resins may be used alone or in combination of two or more of kinds thereof.

The curing agent used for the epoxy resin compound according to the present invention may be any of generally known epoxy resin curing agents. For example, the curing agent may be a phenol-based curing agent, an amine-based curing agent, an acid anhydride-based curing agent, a phenol-based curing agent, a polymercaptan-based curing agent, a polyaminoamide-based curing agent, an isocyanate-based curing agent, and a block isocyanate-based curing agent. The curing agent may be used in combination of two or more kinds. The mixing ratio of the above curing agents may be properly selected in view of the type of curing agent to be mixed or physical properties of a thermal conductive epoxy resin product. Preferably, the curing agent may include an amine-based curing agent including an amine group.

Specific examples of the amine-based curing agent include aliphatic amines, polyetherpolyamines, alicyclic amines, and aromatic amines. Examples of the aliphatic amines include ethylene diamine, 1,3-diaminopropane, 1,4-diaminopropane, hexamethylenediamine, 2,5-dimethylhexamethylenediamine, trimethylhexamethylenediamine, diethylenetriamine, aminobispropylamine, bis(hexamethylene)triamine, triethylenetetramine, tetraethylenepentamine, pentaethylenehexamine, N-hydroxyethylethylenediamine, and tetra(hydroxyethyl)ethylenediamine. Examples of the polyetherpolyamines include triethyleneglycoldiamine, tetraethyleneglycoldiamine, diethyleneglycolbis(propylamine), polyoxypropylenediamine, and polyoxypropylenetriamines. Examples of the alicyclic amines include isophorone diamine, metacendiamine, N-aminoethylpiperazine, bis(4-amino-3-methyldicyclohexyl)methane, bis(aminomethyl)cyclohexane, 3,9-bis(3-aminopropyl)2,4,8,10-tetraoxaspiro(5,5)undecane, and norbornen diamine. Examples of the aromatic amines include tetrachloro-p-xylylenediamine, m-xylylenediamine, p-xylylenediamine, m-phenylenediamine, o-phenylenediamine, p-phenylenediamine, 2,4-diaminoanisole, 2,4-toluenediamine, 2,4-diaminodiphenylmethane, 4,4'-diaminostilbene, 4,4'-diaminodiphenylmethane, 4,4'-diamino-1,2-diphenylethane, 2,4-diaminodiphenylsulfone, 4,4'-diaminodiphenylsulfone, m-aminophenol, m-aminobenzylamine, benzyldimethylamine, 2-dimethylaminomethyl)phenol, triethanolamine, methylbenzylamine, α-(m-aminophenyl)ethylamine, α-(p-aminophenyl)ethylamine, diaminodiethyldimethyldiphenylmethane, and α,α'-bis(4-aminophenyl)-p-diisopropylbenzene.

The curing agent may be included in 0.5 wt % to 5 wt % based on the total weight of the epoxy resin compound.

Further, the epoxy resin compound may include 40 wt % to 97 wt % of inorganic filler based on the total weight of the epoxy resin compound.

When the content of the inorganic filler is less than the above range, it may be difficult to attain effects of the present invention such as high thermal conductivity, low thermal expansibility, and high thermal resistance. By increasing the content of inorganic filler, the above-mentioned effects may be attained but are not improved according to the volume fraction of the inorganic filler. That is, the above-mentioned effects are significantly improved starting from a specific amount of the inorganic filler. The above-described effects are obtained by controlled higher order structure in a polymer state. It seems that a specific amount of the inorganic filler is necessary because the higher order structure is mainly achieved on the surface of the inorganic filler. Meanwhile, when the content of the inorganic filler is more than the above range, the viscosity of the epoxy resin compound may increase to make it difficult to form the epoxy resin compound.

The inorganic filler may preferably have a spherical shape. The shape of the inorganic filler is not limited as long as the inorganic filler has a spherical shape including an elliptical sectional shape. However, it is particularly preferable that the shape of the inorganic filler is close to a perfect spherical shape, in order to improve the fluidity of the epoxy resin compound.

The inorganic filler may be alumina, aluminum nitride, silicon nitride, boron nitride, or crystalline silica, and the like. In addition, two or more different inorganic fillers may be used in combination.

The average particle diameter of the inorganic filler may be lower than 30 μm. When the average particle diameter is higher than the above range, it is preferable because the fluidity and strength of the epoxy resin compound are decreased.

The epoxy resin compound according to the present invention may be mixed with a known curing accelerator. Examples of the curing accelerator include amines, imidazoles, organic phosphines, and Lewis acids. Specifically, examples of the curing accelerator may include: tertiary amines such as 1,8-diazabicyclo(5,4,0)undecene-7, triethylenediamine, benzyldimethylamine, triethanolamine, dimethylamino ethanol, and tris(dimethylaminomethyl)phenol; imidazoles such as 2-methylimidazole, 2-phenylimidazole, 2-phenyl-4-methylimidazole, and 2-heptadecylimidazole; organic phosphines such as tributylphosphine, methyldiphenylphosphine, triphenylphosphine, diphenylphosphine, and phenylphosphine; and tetra substituted phosphoniumtetra substituted borate such as tetraphenylphosphoniumtetraphenylborate, tetraphenylphosphoniummethyltriphenylborate, and tetrabutylphosphoniumtetrabutylborate; and tetraphneylboron salts such as 2-ethyl-4-methylimidazoletetraphenylborate, and N-methylmorphorlintetraphenylborate.

In the epoxy resin compound according to the present invention, wax may be used as a release agent that is generally used for an epoxy resin compound. Examples of the wax include stearic acid, montanic acid, montanic acid ester, and phosphoric acid ester.

In the epoxy resin compound according to the present invention, a coupling agent that is generally used for an epoxy resin compound may be used so as to improve the adhesion between the inorganic filler and the resin component. Examples of the coupling agent include an epoxy silane.

When the epoxy resin compound according to the present invention includes, as main components, the epoxy resin, the curing agent, and the inorganic filler, the epoxy resin compound includes 3 wt % to 60 wt % of the epoxy resin, 40 wt % to 97 wt % of the inorganic filler, and 0.5 wt % to 5 wt % of the curing agent based on the total weight of the epoxy resin compound.

The epoxy resin, the curing agent, the coupling agent, and other components are dissolved in a solvent such as acetone, MEK, MIBK, IPA, butanol, or toluene and are stirred while applying heat. Then, the inorganic filler is added thereto and uniformly mixed using a device such as a mixer. Thereafter, the coupling agent is added to the mixture and the mixture is kneaded using a device such as a heating roll and a kneader. The mixing order of the above components is not particularly limited.

At this time, the solvent is included in 10 wt % to 20 wt % based on the total weight of the epoxy resin compound.

The epoxy resin compound according to one embodiment of the present invention may be applied to a radiant heat circuit board as shown in FIG. 1.

Referring to FIG. 1, the radiant heat circuit board 100 according to the present invention includes a metal plate 110, an insulating layer 120 formed on the metal plate 110, and a circuit pattern 130 formed on the insulating layer 120.

The metal plate 110 may be formed of one of alloys including copper, aluminum, nickel, gold, platinum, and the like that have good thermal conductivity.

The metal plate 110 may include a metal projection (now shown) that constitutes a mounting pad on which a heat-generating device 150 is mounted.

The metal projection may extend and project vertically from the metal plate 110, of which a portion of the upper side serves as a mounting pad for mounting the heat-generating device 150 and has a predetermined width such that solder may be placed.

The insulating layer 120 is formed on the metal plate 110.

The insulating layer 120 may include a plurality of insulating layers. The insulating layer 120 insulates between the metal plate 110 and the circuit pattern 130 on the insulating layer 120.

The insulating layer 120 may be formed by curing the above-described crystalline epoxy resin compound. An inorganic filler 125 is homogeneously dispersed in the insulating layer 120.

A plurality of circuit patterns 130 is formed on the insulating layer 120.

Since the insulating layer 120 according to the present invention is formed of the above-described crystalline epoxy resin compound, the thermal conductivity of the insulating layer 120 is increased so that heat generated from the heat-generating device 150 may be transferred to the metal plate 110 displaced at a lower side thereof.

Hereinafter, the epoxy resin compound according to the present invention will be described in detail with reference to Examples and Comparative Examples. These Examples are not intended to limit the scope of the present invention.

Example 1

All of 4.5 wt % of bisphenol-A, 12.2 wt % of dihydroxynaphthalene, an amorphous epoxy resin including 3 wt % of azomethine epoxy, and an epoxy resin including 1.7 wt % of crystalline epoxy resin represented by Chemical Formula 2, 1.3 wt % of 4,4'-diaminostilbene as an amine-based curing agent, 0.2 wt % of 2-methyl imidazole curing accelerator, and 1 wt % of BYK-W980 additive were mixed and stirred at 40° C. for 10 minutes. Then, 76.1 wt % of alumina inorganic filler was added and stirred at room temperature for 20 to 30 minutes to obtain a crystalline epoxy resin compound of Example 1.

The thermal conductivity of the epoxy resin compound was measured by an unsteady hot wire method using an LFA447 type thermal conductivity meter manufactured by NETZSCH Company.

The glass transition temperature of the epoxy resin compound was measured at a temperature increase rate of 10° C./minute by using a DSC Q100 thermo-mechanical measuring device manufactured by TA Company.

Example 2

All of 3.5 wt % of dihydroxynaphthalene, an amorphous epoxy resin including 9.7 wt % of azomethine epoxy, and an epoxy resin including 3.5 wt % of crystalline epoxy resin represented by Chemical Formula 2, 2 wt % of 4,4'-diaminostilbene as an amine-based curing agent, 0.1 wt % of 2-methyl imidazole curing accelerator, and 0.5 wt % of BYK-W980 additive were mixed and stirred at 40° C. for 10 minutes. Then, 80.7 wt % of alumina inorganic filler was added and stirred at room temperature for 20 to 30 minutes to obtain a crystalline epoxy resin compound of Example 2.

Example 3

All of 7 wt % of bisphenol A, an amorphous epoxy resin including 3.5 wt % of azomethine epoxy, and 4.8 wt % of crystalline epoxy resin represented by Chemical Formula 2, 1.1 wt % of 4,4'-diaminostilbene as an amine-based curing agent, 0.2 wt % of 2-methyl imidazole curing accelerator, and 1 wt % of BYK-W980 additive were mixed and stirred at 40° C. for 10 minutes. Then, 82.4 wt % of alumina inorganic filler was added and stirred at room temperature for 20 to 30 minutes to obtain a crystalline epoxy resin compound of Example 3.

Example 4

All of 5 wt % of bisphenol A, an amorphous epoxy resin including 2 wt % of azomethine epoxy, and 9.2 wt % of crystalline epoxy resin represented by Chemical Formula 2, 1 wt % of 4,4'-diaminostilbene as an amine-based curing agent, 0.1 wt % of 2-methyl imidazole curing accelerator, and 0.8 wt % of BYK-W980 additive were mixed and stirred at 40° C. for 10 minutes. Then, 81.9 wt % of alumina inorganic filler was added and stirred at room temperature for 20 to 30 minutes to obtain a crystalline epoxy resin compound of Example 4.

Example 5

All of 5 wt % of bisphenol A, an amorphous epoxy resin including 1.2 wt % of azomethine epoxy, and 6 wt % of crystalline epoxy resin represented by Chemical Formula 2, 1.2 wt % of 4,4'-diaminostilbene as an amine-based curing agent, 0.1 wt % of 2-methyl imidazole curing accelerator, and 1 wt % of BYK-W980 additive were mixed and stirred at 40° C. for 10 minutes. Then, 85.5 wt % of alumina inorganic filler was added and stirred at room temperature for 20 to 30 minutes to obtain a crystalline epoxy resin compound of Example 5.

Comparative Example 1

All of 15 wt % of bisphenol A, 3 wt % of bisphenol F, 3 wt % of dihydroxynaphthalene, an amorphous epoxy resin including 4.5 wt % of azomethine epoxy, 2.1 wt % of biphenol curing agent, 1 wt % of 2-methyl imidazole curing accelerator, and 1 wt % of BYK-W980 additive were mixed and stirred at 40° C. for 10 minutes. Then, 70.4 wt % of alumina inorganic filler was added and stirred at room temperature for 20 to 30 minutes to obtain a crystalline epoxy resin compound of Comparative Example 1.

Comparative Example 2

All of 12 wt % of bisphenol A, 3.3 wt % of bisphenol F, 3.3 wt % of dihydroxynaphthalene, an amorphous epoxy resin including 7.6 wt % of azomethine epoxy, 2.7 wt % of biphenol curing agent, 0.3 wt % of 2-methyl imidazole curing accelerator, and 0.5 wt % of BYK-W980 additive were mixed and stirred at 40° C. for 10 minutes. Then, 70.3 wt % of alumina inorganic filler was added and stirred at room temperature for 20 to 30 minutes to obtain a crystalline epoxy resin compound of Comparative Example 2.

Comparative Example 3

All of 11.7 wt % of bisphenol A, 1.5 wt % of bisphenol F, 1.5 wt % of dihydroxynaphthalene, an amorphous epoxy resin including 4.2 wt % of azomethine epoxy, 1.1 wt % of biphenol curing agent, 0.6 wt % of 2-methyl imidazole curing accelerator, and 0.6 wt % of BYK-W980 additive were mixed and stirred at 40° C. for 10 minutes. Then, 78.8 wt % of alumina inorganic filler was added and stirred at room temperature for 20 to 30 minutes to obtain a crystalline epoxy resin compound of Comparative Example 3.

Results

Measurement of Thermal Conductivity

Thermal conductivities of the Examples and Comparative Examples were measured by an unsteady hot wire method using an LFA447 type thermal conductivity meter manufactured by NETZSCH Company, and the measurement results are shown in Table 1.

Glass Transition Temperature

Glass transition temperatures were measured at a temperature increase rate of 10° C./minute by using a DSC Q100 thermo-mechanical measuring device manufactured by TA Company, and the measurement results are shown in Table 1.

TABLE 1

| | Thermal conductivity (W/m·K) | Glass transition temperature Tg (° C.) |
| --- | --- | --- |
| Example 1 | 2.13 | 125 |
| Example 2 | 3.34 | 135 |
| Example 3 | 4.13 | 137 |
| Example 4 | 5.64 | 143 |
| Example 5 | 5.12 | 137 |
| Comparative Example 1 | 1.32 | 102.5 |
| Comparative Example 2 | 1.46 | 110 |
| Comparative Example 3 | 2.39 | 121 |

As shown in Table 1, thermal conductivities and glass transition temperatures of Examples 1 to 5 were higher than those of Comparative Examples 1 and 2.

According to the present invention, thermal conductivity can be improved by using the epoxy resin including a mesogen structure that increases crystallinity in an insulating layer.

In addition, the epoxy resin compound is a superior cured product in terms of its low absorbency, low thermal expansibility, and high heat resistance, and may be applied as an insulating material for an electric component.

The features, structures, effects, etc. of embodiments of the present invention described above may characterize at least one embodiment but they do not limit the scope of the present invention itself. It will be apparent to those skilled in the art that the features, structures, effects, etc. of any embodiment may be combined or modified with those of one or more other embodiments without departing from the scope of the present invention.

What is claimed is:

1. An epoxy resin compound comprising an epoxy resin including a crystalline epoxy and an inorganic filler, the epoxy resin compound satisfying the following condition i):
   i) a thermal conductivity of 2.13 (W/m·K) or higher,
      wherein the crystalline epoxy is represented by the following chemical formula 1:

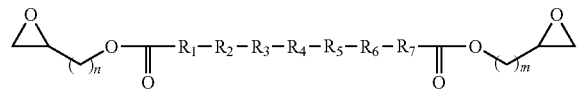

wherein, $R_1$, $R_3$, $R_5$ and $R_7$ each independently represent a single bond, or an aromatic ring structure having C6 to C24;

$R_2$ and $R_6$ each independently represent a single bond or a double bond (i.e., —CH=N—) of C and N, and at least any one of $R_2$ and $R_6$ represents a double bond (i.e., —CH=N—) of C and N;

$R_4$ represents an oxygen atom, a sulfur atom, or a phosphorus atom; and m and n are each independently an integer of 0 to 5 and when m or n is 0, it refers to a single bond;

in which hydrogen of each of $R_1$ to $R_7$ is substituted with at least one group selected from an alkyl group having C1 to C4, an aryl group having C6 to C18, and a cyanide group.

2. The epoxy resin compound of claim 1, which further satisfies the following condition ii):
   ii) a glass transition temperature of 125 (° C.) or higher.

3. The epoxy resin compound of claim 1, wherein the epoxy resin is included in 3 wt % to 60 wt % based on the total weight of the epoxy resin compound.

4. The epoxy resin compound of claim 3, wherein the crystalline epoxy is included in at least 12 wt % based on the total weight of the epoxy resin.

5. The epoxy resin compound of claim 1, wherein the epoxy resin further includes an amorphous epoxy.

6. The epoxy resin compound of claim 1, wherein the inorganic filler is included in 40 wt % to 97 wt % based on the total weight of the epoxy resin compound.

7. The epoxy resin compound of claim 1, further comprising a curing agent, wherein the curing agent is included in 0.5 wt % to 5 wt % based on the total weight of the epoxy resin compound.

* * * * *